US008148682B2

(12) United States Patent
Hotta et al.

(10) Patent No.: US 8,148,682 B2
(45) Date of Patent: Apr. 3, 2012

(54) METHOD AND APPARATUS FOR PATTERN POSITION AND OVERLAY MEASUREMENT

(75) Inventors: Shoji Hotta, Delmar, NY (US); Norio Hasegawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 277 days.

(21) Appl. No.: 12/648,766

(22) Filed: Dec. 29, 2009

(65) Prior Publication Data

US 2011/0155904 A1   Jun. 30, 2011

(51) Int. Cl.
*G01N 23/00* (2006.01)
(52) U.S. Cl. .................. 250/307; 345/441; 382/144
(58) Field of Classification Search ............ 250/307
See application file for complete search history.

(56) References Cited

U.S. PATENT DOCUMENTS

| | | | |
|---|---|---|---|
| 6,456,736 | B1 | 9/2002 | Su et al. |
| 7,127,319 | B2 | 10/2006 | Byers et al. |
| 7,266,800 | B2 * | 9/2007 | Sezginer ................ 716/52 |
| 7,916,141 | B2 * | 3/2011 | Choi et al. .............. 345/441 |
| 2004/0169861 | A1 | 9/2004 | Mieher et al. |
| 2005/0136340 | A1 * | 6/2005 | Baselmans et al. ........ 430/5 |
| 2006/0023933 | A1 | 2/2006 | Mitsui |
| 2007/0230770 | A1 | 10/2007 | Kulkarni et al. |
| 2008/0130982 | A1 * | 6/2008 | Kitamura et al. ......... 382/144 |

OTHER PUBLICATIONS

Higuchi et al., "Exploring New Metrology for Complex Photomask Patterns", Proc. of SPIE, vol. 7122, 71222S—pp. 1-10 (2008).

Ausschnitt et al., "Combinatorial Overlay Control for Double Patterning", Mems Moems Jan.-Mar. 2009/vol. 8, pp. 011008-1 to 011008-8.
Englard et al., "Metrology Challenges for Advanced Lithography Techniques", Proc. of SPIE, vol. 6518, pp. 65181G-1 to 65181G-9.
Englard et al., "Accurate in-resolution Level Overlay Metrology for Multi Patterning Lithography Techniques", Proc. of SPIE, vol. 6922, pp. 69221D-1 to 69221D-9.
Ausschnitt et al., "Multi-layer Overlay Metrology", Proc. of SPIE, vol. 6152, pp. 615210-1 to 615210-10.
Robinson et al., "A Comparison of Methods for In-chip Overlay Control at the 65 nm Node", Proc. of SPIE, vol. 5375, pp. 384-394.
Huang et al., "Scatterometry-Based Overlay Metrology", Proc. of SPIE, vol. 5038, pp. 126-137.

* cited by examiner

*Primary Examiner* — Phillip A Johnston
(74) *Attorney, Agent, or Firm* — Miles & Stockbridge P.C.

(57) ABSTRACT

Systems and methods using imaged device patterns to measure overlay between different layers in a semiconductor manufacturing process, such as a double-patterning process. Images of pattern features are acquired by scanning electron microscopy. The position of a patterning layer is determined using positions of pattern features for the patterning layer in the images. A relative position of each patterning layer with respect to other pattern features or patterning layers is determined in vector form based on the determined pattern positions. Overlay error is determined based on a comparison of the relative position with reference values from design or simulation. Overlay can be measured with high precision and accuracy by utilizing pattern symmetry.

20 Claims, 13 Drawing Sheets

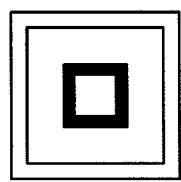
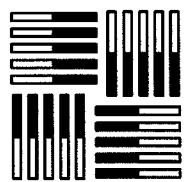
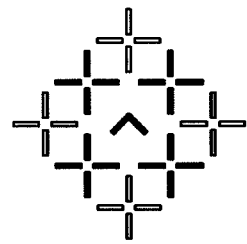
FIG. 1A          FIG. 1B          FIG. 1C
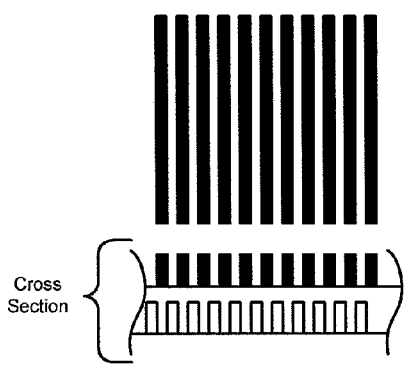
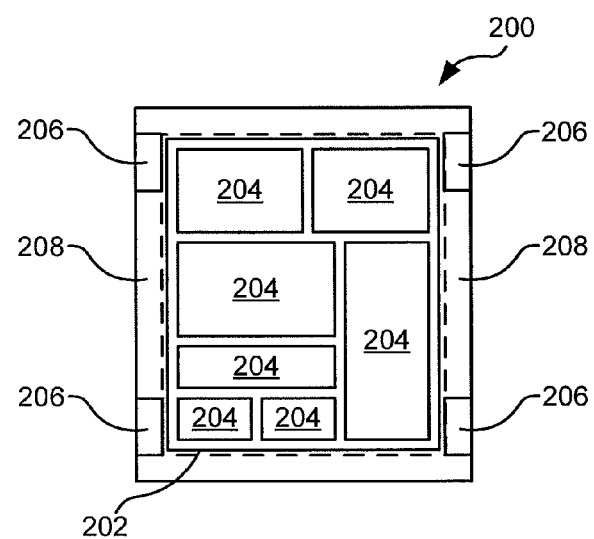
FIG. 1D          FIG. 2
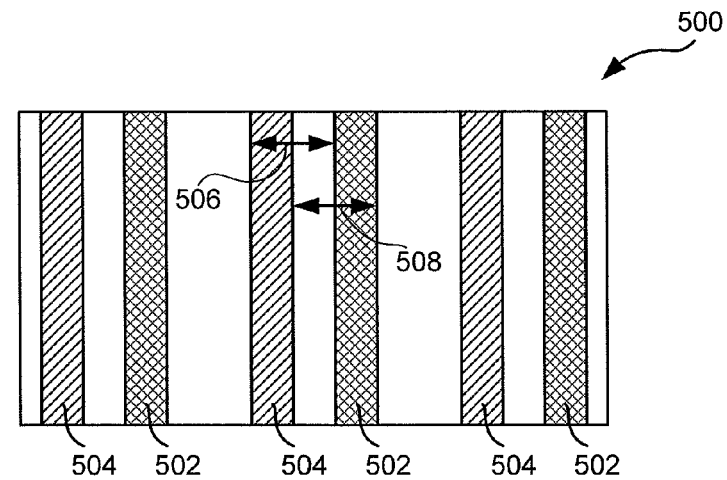
FIG. 5

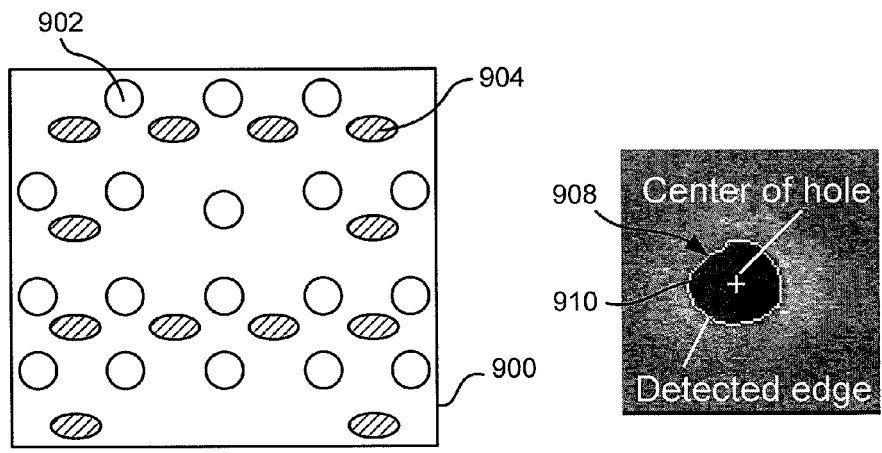
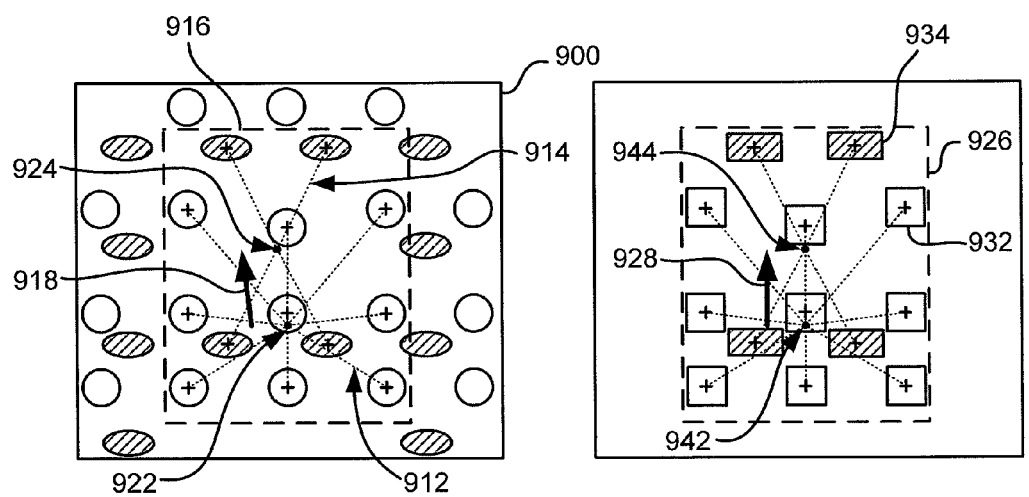
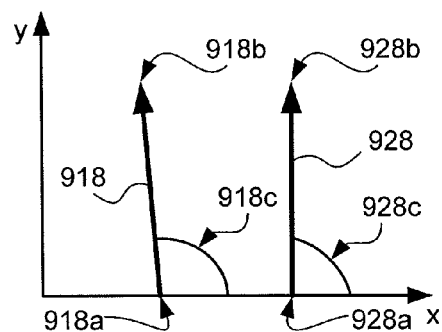
FIG. 9A    FIG. 9B
FIG. 9C    FIG. 9D
FIG. 9E

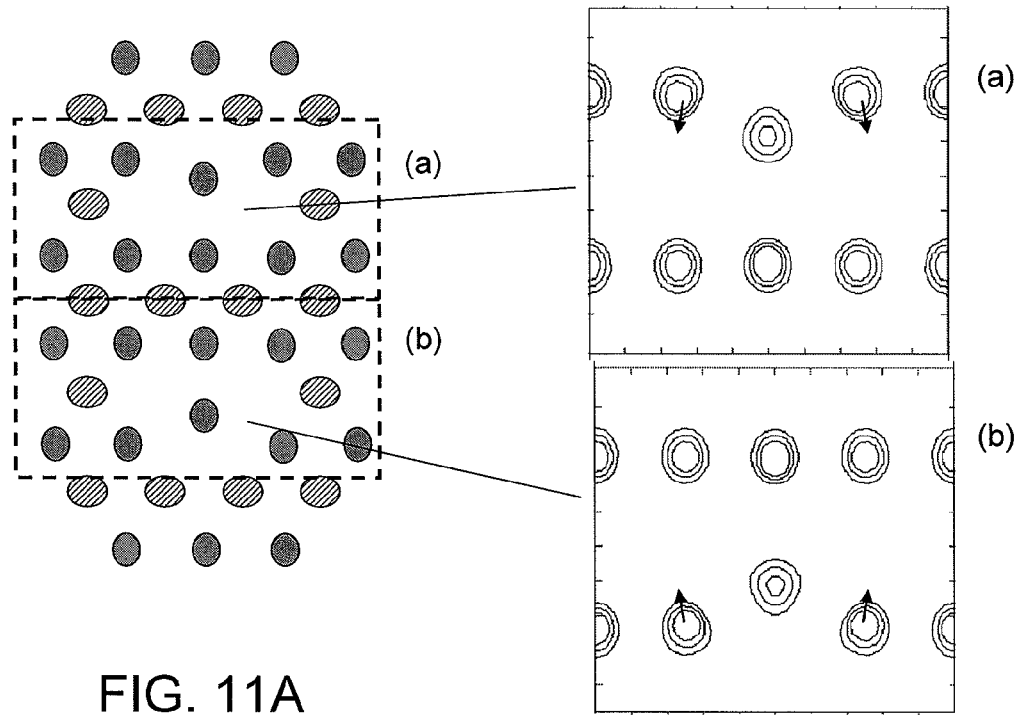
FIG. 11A
FIG. 11B
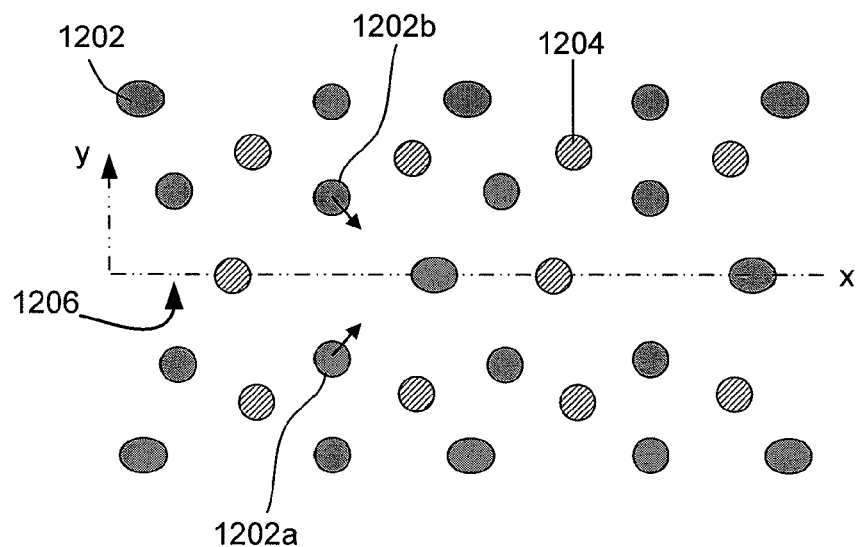
FIG. 12

METHOD AND APPARATUS FOR PATTERN POSITION AND OVERLAY MEASUREMENT

TECHNICAL FIELD

The present application relates generally to measurement and evaluation of pattern features from images thereof, and, more particularly, to overlay measurement of semiconductor device pattern features from scanning electron microscope images thereof.

BACKGROUND

A semiconductor device is formed by patterning one or more layers on a semiconductor substrate or wafer. In the semiconductor manufacturing process, the overlay between previous patterned layers and a current layer to be patterned is controlled to within a tight tolerance, referred to as an overlay error budget. Typically, overlay between different layers has been measured by optical microscopy of relatively large targets specifically designed for overlay analysis. These targets are referred to as optical overlay targets, examples of which are shown in FIGS. 1A-1D. The sizes of these overlay targets vary from between 10 µm and 40 µm.

Overlay is independently measured for each subsequently patterned layer with respect to the previously patterned layer, thus requiring overlay targets positioned on each layer. Moreover, to allow for independent measurement, overlay targets should not overlap. Overlay targets thus require a significant amount of substrate area because of these size and non-overlap requirements. To improve overlay measurement precision, additional sampling is desired. Thus, there exists necessarily a trade-off between overlay target size and location with overlay measurement precision due to semiconductor device area considerations.

To accommodate these requirements, the targets are typically provided in a dicing area, which is used to separate the semiconductor devices into individual chips. For example, a section 200 of a wafer is shown in FIG. 2. A semiconductor chip 202 includes one or more circuit blocks 204 formed by patterning of successive layers on the wafer. Optical overlay targets 206 are provided in dicing lanes 208 to provide alignment control between the patterning of the different layers. After formation of the semiconductor chip 202 is complete, the dicing lanes 208 are cut with a dicing saw to create individual chips.

However, there can be a significant difference in the overlay at optical overlay targets and at actual device patterns due to differences in location on a semiconductor device or wafer. Accordingly, the optical overlay targets 206 located in dicing lanes 208 may not adequately reflect the overlay between pattern features in various layers of the semiconductor chip 202. Such a difference may be negligible when dealing with larger feature sizes. However, as pattern features continue to shrink, tighter tolerances are required such that any difference in overlay between the overlay targets and the actual device patterns becomes increasingly important. For example, for pattern features in the 22 nm feature size regime overlay tolerances less than 10 nm are necessary.

SUMMARY

Embodiments of the present invention address the above-mentioned problems and limitations, among other things.

In embodiments, actual device patterns imaged via scanning electron microscopy (SEM) are used to measure overlay between different layers in a semiconductor manufacturing process, for example, a double-patterning process. Images of features from two or more patterning layers are acquired by SEM. An edge detection algorithm is applied to all or a selected portion of the features in the images. The relative positions of these features are then determined using the detected edge information. The position of a respective patterning layer can thus be determined using the relative position information of all or a selected portion of the imaged features for the respective patterning layer. A relative position of each patterning layer with respect to the other patterning layers is determined, for example, in vector form, based on the determined feature positions. Overlay error between the two or more patterning layers is determined based on a comparison of the relative position with reference values from design or simulation.

In embodiments, a method for measuring relative positions of a plurality of semiconductor device layers includes selecting one or more patterns for each semiconductor device layer. Each semiconductor device layer includes one or more patterns. The one or more selected patterns are selected based on line symmetry or point symmetry of said patterns within at least one said semiconductor device layer. The method further includes obtaining one or more CD-SEM images of the selected patterns. The method also includes calculating a relative pattern position between each semiconductor device layer based on the obtained CD-SEM images.

In embodiments, a method for measuring relative positions of a plurality of semiconductor device layers in a double-patterning semiconductor fabrication process includes selecting a plurality of patterns for each semiconductor device layer. Each semiconductor device layer is formed using a different mask. The plurality of patterns includes contact holes for a semiconductor device. The plurality of selected patterns is selected based on a symmetry of the contact holes in at least a first pattern of the plurality of selected patterns. The symmetry of contact holes is determined with respect to at least one line extending in a first direction across the first pattern.

The method further includes obtaining one or more critical dimension scanning electron microscope (CD-SEM) images of the selected patterns. A magnification used for confirming the positions of the patterns is lower than that used for the obtaining one or more CD-SEM images. The method also includes extracting edge information associated with the patterns in the CD-SEM images. The edge information includes a contour of at least one of the selected patterns.

The method further includes determining a pattern position for each semiconductor device layer by calculating a pattern position centroid of each of the selected patterns based on the edge information. The method further includes calculating a relative pattern position between each semiconductor device layer based on the determined pattern positions. The relative pattern position includes position information in two dimensions.

The method also includes displaying on an output display device the relative pattern position between each semiconductor device layer in vector form and displaying on the output display device the pattern position of each semiconductor device layer together with the relative pattern position between each semiconductor device layer. The method further includes comparing the relative pattern position between each said semiconductor device layer to a predetermined reference value and outputting a notification if a difference between the relative pattern position and the predetermined reference vector exceeds a predetermined tolerance.

In embodiments, a system for measuring relative positions of a plurality of semiconductor device layers in a double-patterning semiconductor device fabrication process includes an image acquisition module, an image processing module, a display device, and an output module. The image acquisition module is configured to select a plurality of patterns for each semiconductor device layer and to obtain one or more CD-SEM images of the selected patterns. Each said semiconductor device layer is formed using a different mask. A magnification used to confirm the position of the patterns is lower than that used to obtain the one or more CD-SEM images. The plurality of patterns includes one or more patterns comprising a portion of a semiconductor device and contact holes for the semiconductor device. The plurality of selected patterns is selected based on a symmetry of the contact holes in at least a first pattern of the plurality of selected patterns. The plurality of patterns includes a second pattern overlaid with the first pattern. The symmetry of contact holes is determined with respect to at least one line extending in a first direction across the first pattern. The contact holes further include holes in the second pattern. The symmetry of contact holes is determined with respect to the line extending in the first direction across said first pattern and a second line extending in a second direction different from that of the first line.

The image processing module is configured to extract edge information associated with the selected patterns in the CD-SEM images. The edge information includes a contour for each selected pattern. The image processing module is further configured to calculate pattern position centroids of each of the selected patterns based on the edge information. The image processing module is also configured to determine a pattern position for each semiconductor device layer based on the calculated pattern position centroids. The image processing module is further configured to calculate a relative pattern position between each semiconductor device layer based on the determined pattern positions and to compare the relative pattern position between each semiconductor device layer to a predetermined reference value. The relative pattern position includes two-dimensional position information.

The output module is configured to output to the display device a notification if the difference between the relative pattern position and the predetermined reference vector exceeds the predetermined tolerance and to output to the display device the pattern position for each semiconductor device layer together with the relative pattern position in vector form.

BRIEF DESCRIPTION OF THE DRAWINGS

The foregoing and other aspects, features, and advantages of the present invention will be better appreciated from the following description of the preferred embodiments, considered with reference to the accompanying drawings, wherein:

FIG. 1A is an example of a box-in-box optical overlay target;

FIG. 1B is an example of an AIM optical overlay target;

FIG. 1C is an example of a blossom optical overlay target;

FIG. 1D is an example of a scatterometry overlay target;

FIG. 2 is a plan view of a semiconductor chip formed on a semiconductor wafer;

FIG. 5 is a view showing one-dimensional line structures for measuring overlay;

FIG. 9A is an image of a double-pattern formed on a substrate;

FIG. 9B is an annotated SEM image of an exemplary pattern formed on a substrate;

FIG. 9C is a diagram of the double-pattern of FIG. 9A illustrating the determination of relative pattern position vector, according to one or more embodiments;

FIG. 9D is a diagram of a design for the double-pattern of FIG. 9A illustrating the determination of a reference pattern position vector, according to one or more embodiments;

FIG. 9E is a graph comparing the relative pattern position vector of FIG. 9C and the reference pattern position vector of FIG. 9D;

FIG. 11A is a diagram of a double-pattern formed on a substrate;

FIG. 11B is a diagram of a simulation of the shift of the first pattern due to variations in focus during lithography of the first pattern where the first pattern has symmetry;

FIG. 12 is a diagram of a double-pattern formed on a substrate illustrating the position shift with symmetrical patterns due lithographic focus variations;

DETAILED DESCRIPTION

Figure 3:
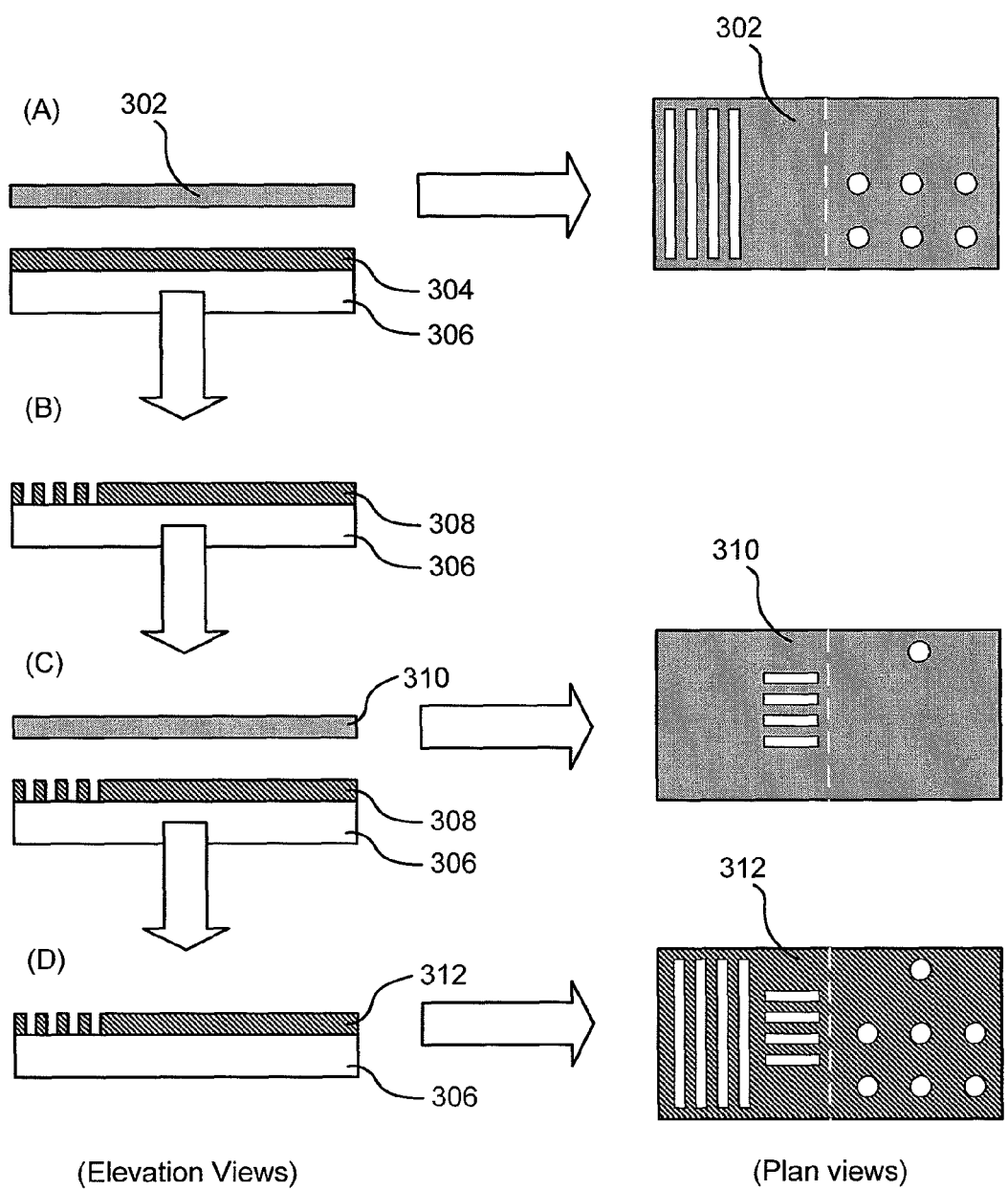
FIGS. 3(A) to 3(D) are elevation views and corresponding plan views illustrating various steps in a double-exposure type double-patterning semiconductor device manufacturing process.

Embodiments of the present invention will hereinafter be described in detail with reference to the accompanying drawings, wherein like reference numerals represent like elements. The accompanying drawings have not been drawn to scale. Any data presented in the accompanying graphs and figures is for illustration purposes only and may not represent actual data. Where applicable some features have not been illustrated to assist in the description of underlying features.

According to various embodiments, actual device patterns are used instead of optical overlay targets to determine the overlay difference between layers. For small feature sizes (e.g., less than 100 nm), the actual device patterns cannot be observed by optical microscopy because the dimensions are much smaller than the wavelengths employed by optical microscopy. Thus, in order to view the actual device patterns, a CD-SEM is used instead of optical microscopy. Overlay measurement by CD-SEM requires patterns of both layers to appear on the imaged surface because secondary electrons can be collected by CD-SEM only from the imaged surface. Double-patterning semiconductor manufacturing processes are amenable to CD-SEM analysis since the pattern features of the two different layers are located on the imaged surface when the analysis is conducted.

An example of a double-patterning process is shown in FIGS. 3(A) to 3(D). The illustrated process is a double-exposure type double-patterning process. First, as shown in FIG. 3(A), a mask 302 with a first pattern thereon is used to transfer the first pattern to a photoresist layer 304 on a substrate 306. The developed photoresist layer 308 thus has the first pattern thereon, as shown in FIG. 3(B). The mask 310 with a second pattern thereon is used to transfer the second pattern to the photoresist 308, as shown in FIG. 3(C). As a result, the photoresist 312 has both the first pattern and the second pattern, as shown in FIG. 3(D). The photoresist 312 can then be used as a template for subsequent material addition or deletion steps.

Figure 4:
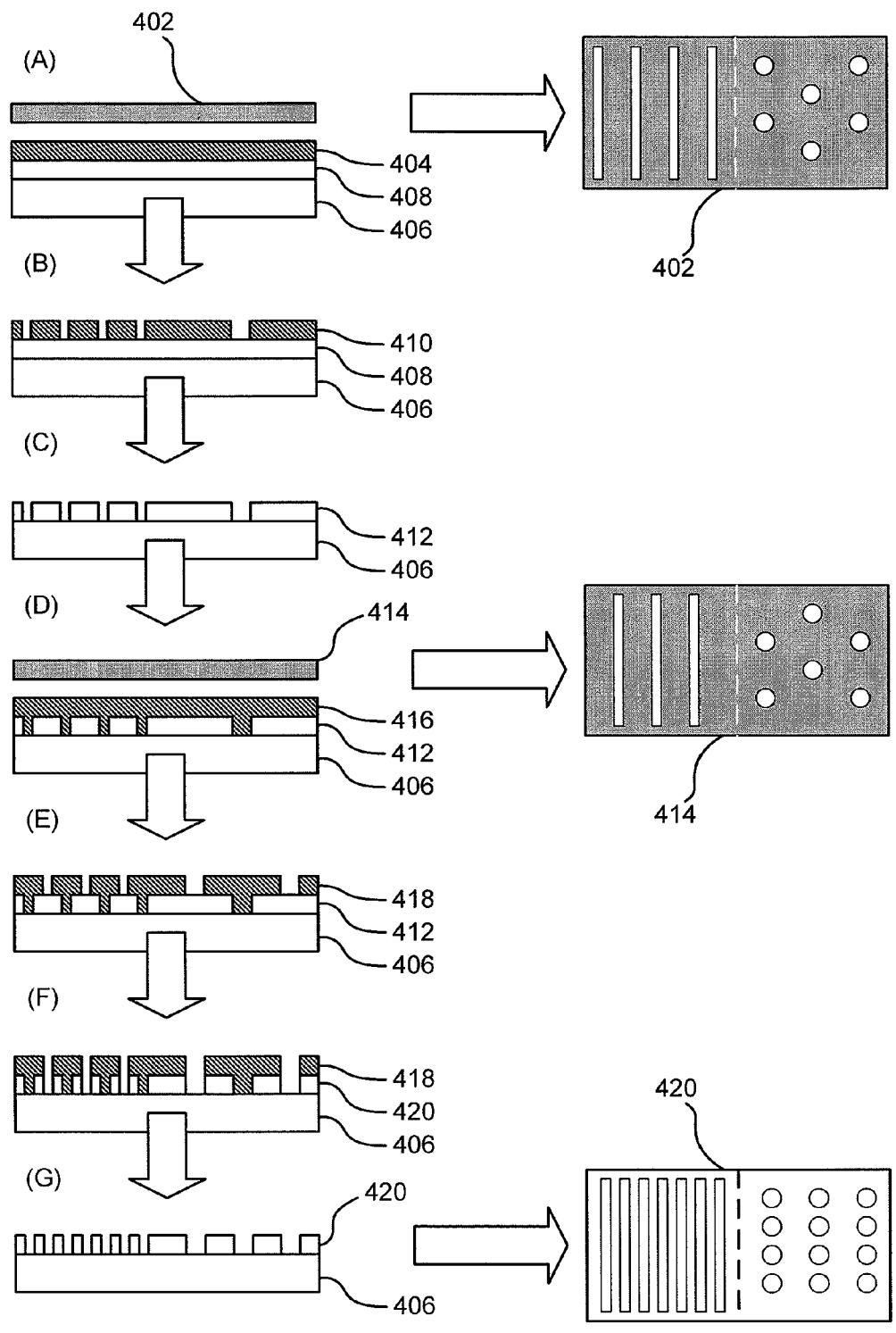
FIGS. 4(A) to 4(G) are elevation views and corresponding plan views illustrating various steps in a double-exposure, double-etch type double-patterning semiconductor device manufacturing process.

Another example of a double-patterning semiconductor device manufacturing process is shown in FIGS. 4(A) to 4(G). The illustrated process is a double-exposure, double-etch type double-patterning process. First, a mask 402 with a first pattern thereon is used to transfer the first pattern to a photoresist layer 404 on a hard mask layer 408 on a substrate 406, as shown in FIG. 4(A). The developed photoresist layer 410 thus has the first pattern thereon, as shown in FIG. 4(B). The first pattern is transferred from the patterned photoresist 410 to the hard mask layer 408, for example, by etching, as shown in FIG. 4(C). A new photoresist layer 416 is then provided on the patterned hard mask layer 412, as shown in FIG. 4(D). A mask 414 with a second pattern thereon is used to transfer the second pattern to the photoresist 416, as shown in FIG. 4(E). The second pattern is transferred from the patterned photoresist 418 to the hard mask layer 412, for example, by etching, as shown in FIG. 4(F). The resulting hard mask layer 420 thus has both the first and second patterns, as shown in FIG. 4(G). The hard mask layer 420 can then be used as a template for subsequent material addition or deletion steps.

In general, a double-patterning process is used to enhance feature density by using multiple lithographic processes to form a single layer. Thus, spacing between pattern features in the device can effectively be reduced even though the masks used in the pattern transfer process may have comparatively larger feature spacing. When dealing with reduced pattern spacing, even slight errors in alignment between the patterning steps can affect the arrangement of the first and second patterns with respect to each other. Thus, conventional optical overlay targets and their attending measurement techniques may be insufficient to provide the necessary tolerances for double-patterning processes.

For double-patterned line structures, overlay can be measured by CD-SEM using a pitch measurement technique. For example, FIG. 5 shows a view 500 of line structures formed using a double-patterning process. Lines 502 are part of a first pattern and lines 504 are part of a second pattern. Overlay error, ε, between the first pattern and the second pattern can be determined based on the following formula:

$$\varepsilon = \frac{(P_L + P_R)}{2} - P_D; \tag{1}$$

where $P_L$, is the distance 506 between the respective left edges of the lines 502 and 504, $P_R$ is the distance 508 between the respective right edges of the lines 502 and 504, and $P_D$ is the designed half-pitch for the lines 502 and 504. Such a pitch measurement method can be applied only to the overlay measurement of one-dimensional structures, such as simple line and space patterns. For two-dimensional structures, overlay needs to be characterized in two directions. Thus, the pitch measurement technique may not be applicable to two-dimensional structures.

Figure 6:
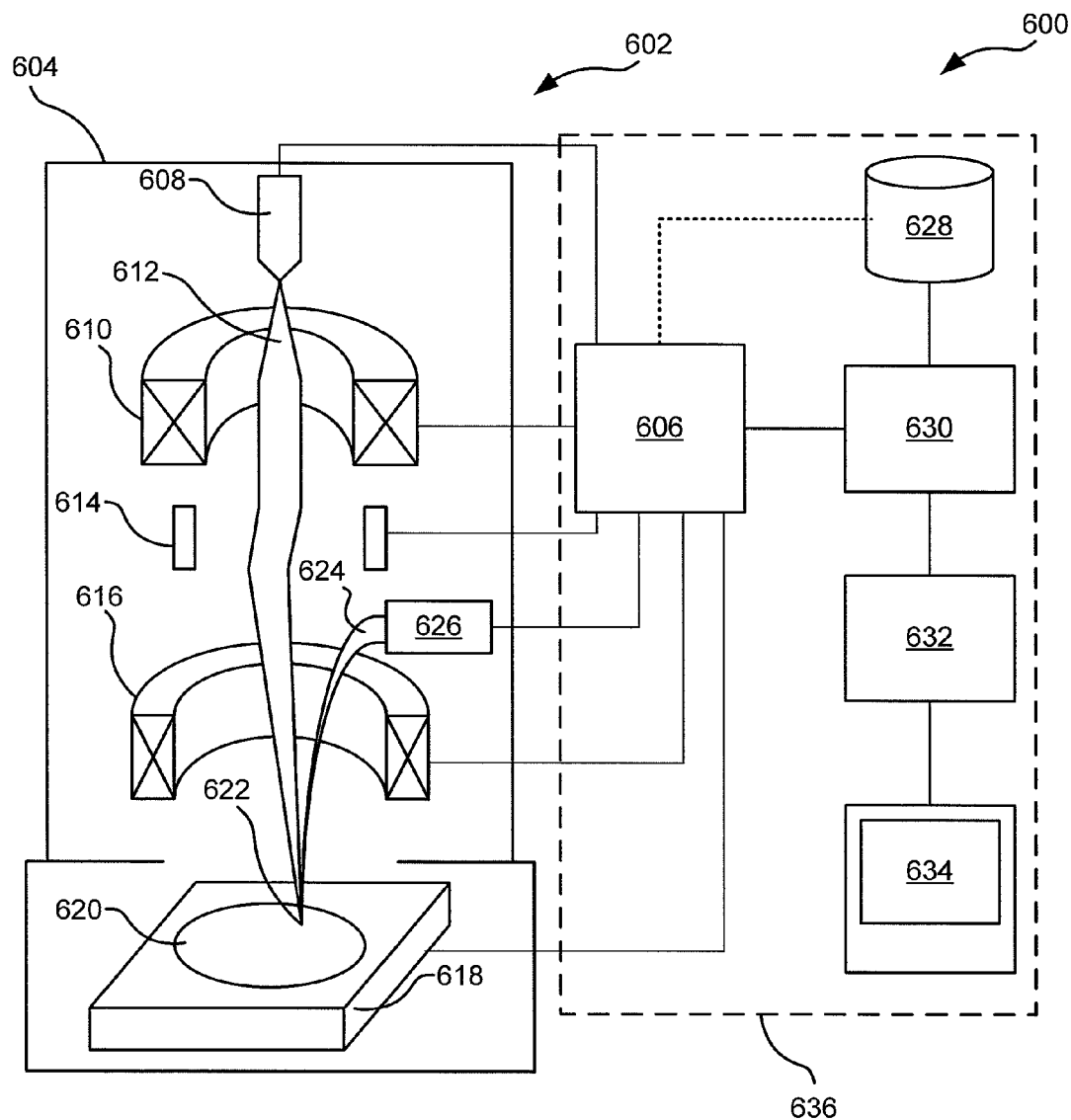
FIG. 6 is a diagram of a measurement system for evaluating pattern overlay, according to one or more embodiments.

FIG. 6 shows a measurement system 600 for evaluating the degradation of pattern features according to various embodiments. The measurement system 600 includes a microscope for imaging minute features of a sample. For example, the microscope is a critical-dimension scanning electron microscope (CD-SEM) 602. The CD-SEM 602 includes a microscope column 604 with a variety of components for electron beam generation and detection. An electron gun 608 produces an electron beam 612, the direction and width of which are controlled using a first electromagnetic lens 610, a second electromagnetic lens 616, and a deflector 614. The electron beam 612 irradiates a particular location 622 on a sample 620 with electrons thereby generating secondary electrons 624.

For example, targets 622 may be individual chips or patterns on a semiconductor wafer. The sample 620 is supported by a microscope stage 618, which manipulates the position of the sample 620 with respect to the electron beam 612. The secondary electrons 624 emanating from location 622 are detected by a secondary electron detector 626. The secondary electrons 624 are used to generate an image of the sample 620 at target 622.

The measurement system 600 also includes an image acquisition module 606. Image acquisition module 606 may be integrated with the CD-SEM 602 or may be a stand alone component, such as a programmed computer or processor. The image acquisition module 606 is operatively connected to and controls the various components of the CD-SEM 602, including the electron gun 608, the electromagnetic lenses 610 and 616, the deflector 614, and the microscope stage 618 to image sample 620. The image acquisition module 606 receives secondary electron data from the secondary electron detector 626, which is then used to form an image.

The image acquisition module 606 directs the CD-SEM 604 to image one or more patterns for each semiconductor device layer to be analyzed on the sample 620. For example, the CD-SEM 604 images the sample 620 at a first, relatively low magnification level. Based on the low-magnification image, the image acquisition module 606 may confirm the position of the patterns. The image acquisition module 606 may receive input on patterns of interest from a user, for example, through an appropriate input/output device. The image acquisition module 606 then directs the CD-SEM 604 to obtain second, relatively high magnification images of the selected pattern or patterns. The second magnification may be greater than the first magnification. Image data can optionally be stored in memory 628.

The measurement system also includes an image processing module 630. The image processing module 630 receives the image data, including high magnification images of the selected pattern or patterns, from the memory 628. Alternatively, the image processing module 630 receives the image data directly from the image acquisition module 606. Image data is analyzed by the image processing module 630 to determine, among other things, overlay between patterns on a substrate. The results of the analysis are stored in memory 628 or another memory device (not shown), or transmitted to one or more additional components.

The image processing module 630 can be operatively connected to an output module 632. The overlay data and images from the image processing module 630 can be conveyed to the output module 632. The output module 632 can be operatively connected to a display device 634. The output module 632 can output to the display device 634 an overlay measurement for display thereon. Additionally, the display device 634 can also display, for example, an indication that the overlay error exceeds a predetermined tolerance, images of the patterns, and/or a line of symmetry for the patterns.

It is noted that various components illustrated in FIG. 6 need not be embodied as separate components. Rather, one or more of the image acquisition module 606, image processing module 630, memory 628, output module 632, and display device 634 may be embodied as a single computer or processor 636, or as separate modules operatively connected together, such as independent computers or processors connected together using data transmission or interfacing means. The modules 606, 630, and 632 may also be combined with one or more other modules, for example, as part of quality control processors or controllers in a semiconductor manufacturing line. Likewise, the memory 628 may be separated into multiple memory devices or shared amongst multiple components.

Moreover, one or more of the modules 606, 630, and 632 may be integrated with the SEM 602. Although separate components are illustrated in FIG. 6 with associated functions discussed above, components may be added, omitted, or combined and/or functions may be added, omitted, or transferred amongst components without departing from the spirit and scope of the disclosed embodiments.

Furthermore, a sequence of programmed instructions that, when executed by the modules 606, 630, 632, and 634, and/or processor 636, cause the modules to perform the operations herein described, can be stored using the memory 628. Accordingly, memory 638 can be a computer or processor readable storage medium.

Figure 7:
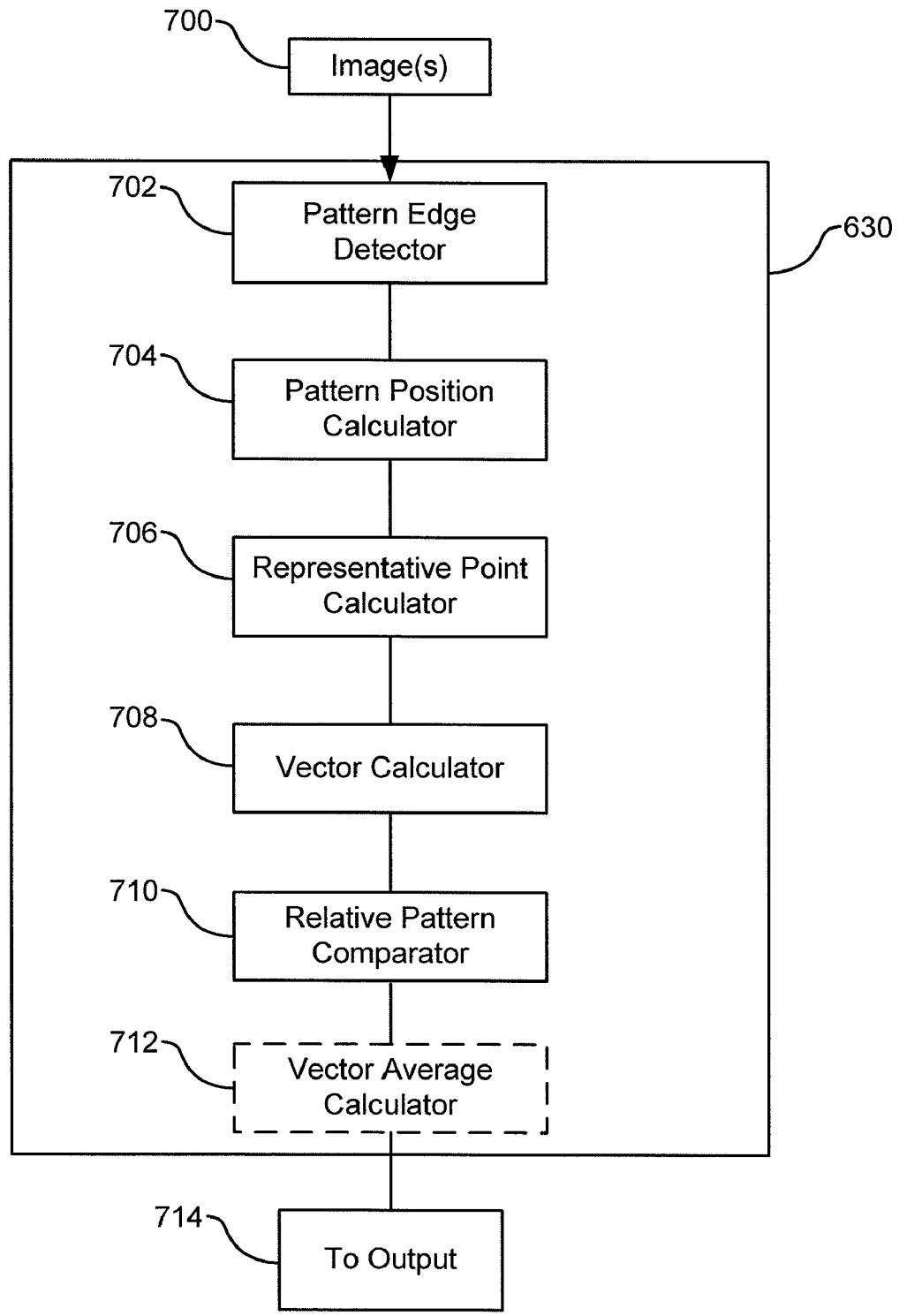
FIG. 7 is a diagram of an image processing module for use in the measurement system of FIG. 6.

Referring now to FIG. 7, image processing module 630 may include a variety of sub-modules, for example, a pattern edge detection module 702, a pattern position calculation module 704, a representative point calculation module 706, a vector calculation module 708, a vector average calculation module 712, and a relative pattern comparison module 710. Pattern edge detection module 702 receives one or more images 700 of the selected pattern(s) for each layer of interest formed on sample 620.

The pattern edge detection module 702 receives and processes the images 700 so as to extract edge information associated with the selected patterns in the image. For example, the edge information can include a contour of each pattern edge. The pattern edge detection module 702 conveys the edge information to pattern position calculation module 704, which uses the edge information to determine a position of each selected pattern. For example, the pattern position calculation module 704 determines a centroid for each selected pattern based on the edge information. The centroid may thus represent a location of the pattern within the respective layer.

The representative point calculation module 706 receives the position information of each selected pattern from pattern position calculation module 704. Using the position information for each selected pattern associated with a particular layer, the representative point calculation module 706 determines a position of the particular layer, as discussed in detail herein. For example, the representative point calculation module 706 determines a representative point for the layer within one of the CD-SEM images by averaging the coordinates of the individual selected pattern positions associated with the layer. The representative point calculation module 706 determines a representative point for each layer to be analyzed. In the case of a double-patterning process, two layers may be imaged simultaneously, and thus representative points are determined for each of the two layers based on their respective patterns in the CD-SEM image.

The representative points are conveyed to the vector calculation module 708. The vector calculation module 708 is designed to compare the position of the layers to thereby determine the relative position of the layers. For example, the vector calculation module 708 calculates one or more vectors extending between the representative points for the layers. The relative pattern comparison module 710 compares the resulting vectors from the vector calculation module 708 with designed or simulated values to determine the overlay between layers and any deviation from ideal values. If the overlay deviates outside of an overlay error budget, an error indication can be output to a user. The layer overlay and/or an error indicator can be communicated via output 714, such as an output module, display device, or other module in a semiconductor device manufacturing process.

Figure 8:
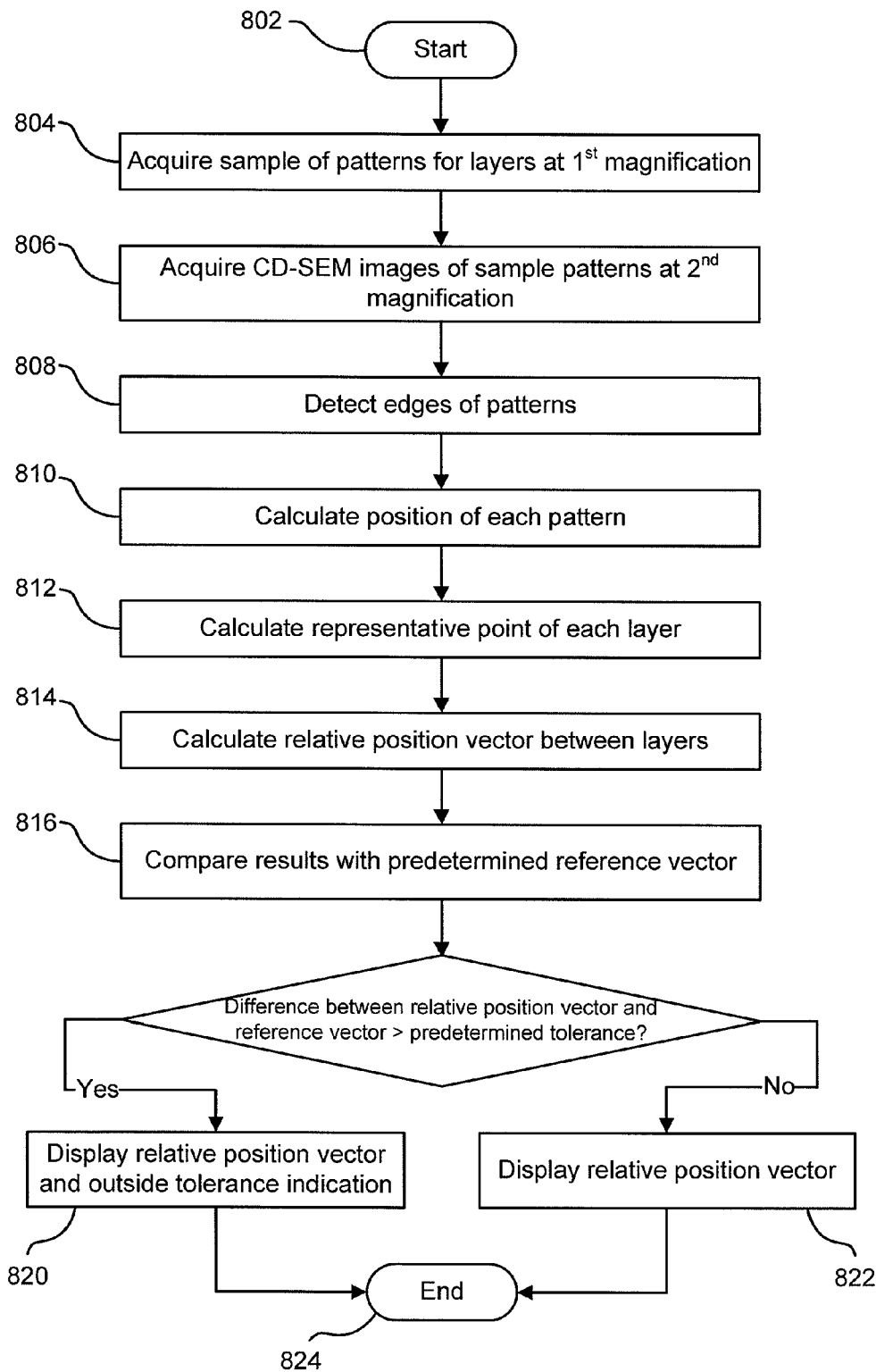
FIG. 8 is a process flowchart illustrating steps for acquiring and analyzing CD-SEM images, according to one or more embodiments.

Referring now to FIG. 8, a process flowchart for acquiring and analyzing CD-SEM images according to one or more embodiments is shown. The process commences at 802 and proceeds to step 804. At step 804, structures formed on a substrate are imaged at a first low magnification to confirm the position of the patterns. Based on the low magnification image or images, a sample of the patterns can be selected for further analysis. Although this procedure may be skipped, it may be advantageous to use low magnification to confirm the position of the patterns in selecting the pattern at step 806.

The process then proceeds to step 806. At step 806, one or more CD-SEM images are obtained for the one or more selected patterns for each layer. For example, an image 900 of patterns formed in a double-patterning process is shown in FIG. 9A. Patterns 902 are formed in a first layer while patterns 904 are formed in a second layer.

The CD-SEM images are obtained at a second magnification, which may be greater than the first magnification. Multiple CD-SEM images may be necessary to allow imaging of an entire area of interest at the second magnification level. It is further contemplated that, in some applications, the first and second magnification levels may be the same.

The process then proceeds to step 808. In step 808, the edges of all or only a portion of selected patterns in the acquired images are detected using, for example, conventional image processing techniques for critical dimension metrology. FIG. 9B shows an SEM image of a contact hole pattern in a semiconductor device layer. Image processing techniques are used to locate the edge 908 of the pattern.

Referring again to FIG. 8, the process proceeds to step 810. In step 810, the detected edge data is then used to calculate the position of individual patterns in the acquired images. For example, the position of each pattern is determined by averaging coordinates of points lying on the edge of the pattern. In another example, a center of the pattern may be calculated based on a mathematical function that is fit to the edge data for the pattern. With reference to FIG. 9B, the pattern edge 908 is used to determine a center 910 of the pattern. Alternatively, other image processing techniques may be employed to determine the center 910 of the pattern without using the pattern edge 908.

Referring again to FIG. 8, the process proceeds to step 812, wherein a representative point is calculated for each layer based on the position of each pattern in the acquired images. The positions of all or selected patterns which belong to one layer in acquired images define the position of that layer by calculating a representative position for the layer based on those patterns. For example, the representative position for a layer is the average of all the coordinates of all the selected pattern positions, or an average of the coordinates for the determined centers for the selected patterns.

As shown in FIG. 9C, a portion of the patterns within window 916 are selected for analysis. The centers of patterns 902 formed in the first layer are used to determine a representative layer point 922. The point 922 may be determined, for example, by averaging all the coordinates of all the selected pattern positions. Similarly, the centers of patterns 904 formed in the second layer are used to determine a representative layer point 924. The point 924 may be determined, for example, by averaging all the coordinates of all the selected pattern positions.

Referring again to FIG. 8, the process then proceeds to step 814. In step 814, a relative position vector is calculated to determine the relative position of layers. For example, a relative position vector is determined using the layer positions of respective layers in a double-patterning process. In FIG. 9C, a relative position vector 918 extends between representative point 922 for the first layer and representative point 924 for the second layer.

The process then proceeds to step 816. In step 816, the determined relative position vector is compared to a predetermined reference value. For example, the relative position vector is compared with a calculated or simulated reference vector. The calculated reference vector may be based on a design layout for the layers. The simulated reference vector may be based on a simulated contour. FIG. 9D illustrates an example for calculating a reference vector between the first and second layers. Field of view 926 represents the design layout for the selected portion 916 of FIG. 9C. The patterns 932 on the designed first layer yield a representative point 942, while patterns 934 on the designed second layer yield a representative point 944. A reference vector 928 extends between representative point 942 and representative point 944. Reference vector 928 is thus indicative of the designed relative orientation between the first and second layers.

The comparison contemplated in step 816 may take the form of, for example, a vector comparison. Such a comparison may be based on a direction and magnitude of each vector. Referring to the graph of FIG. 9E, the reference vector 928 and the relative position vector 918 are shown side by side. A magnitude of the relative position vector 918 is determined based on the coordinates of the origin 918a and the end point 918b. The direction of the relative position vector 918 is determined based on an angle 918c with respect to the x-axis. Similarly, a magnitude of the reference position vector 928 is determined based on the coordinates of the origin 928a and the end point 928b. The direction of the reference position vector 928 is determined based on an angle 928c with respect to the x-axis. Overlay between the layers may be determined based on a comparison of the vector magnitudes and directions. Note that the origins and the end points for the vectors correspond to the respective representative points for each layer. Other methods for comparison are also contemplated. For example, vector subtraction or a comparison of the x- and y-components of the vector may be used.

Returning to FIG. 8, the process then proceeds to step 818. If the difference between the relative position vector and the reference vector is determined to be greater than the predetermined tolerance, the process proceeds to step 820 where the relative position vector and an indication that the overlay error is out of tolerance is displayed. If the difference between the relative position vector and the reference vector is determined to be less than the predetermined tolerance, the process proceeds to step 822 where the relative position vector is displayed. The process thus terminates at step 824.

Figures 10A, 10B, 10C:
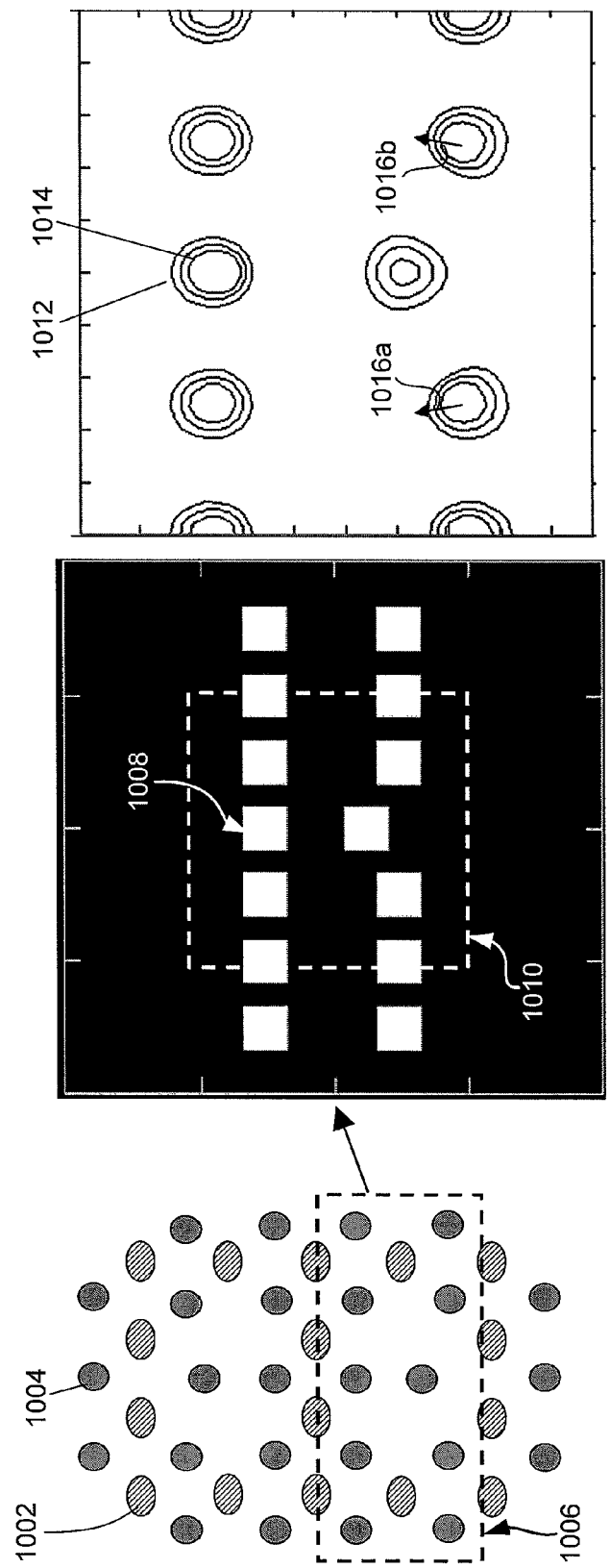
FIG. 10A is a diagram of a double-pattern formed on a substrate.
FIG. 10B is a diagram of a mask pattern for formation of the first pattern in the double-pattern of FIG. 10A.
FIG. 10C is a diagram of a simulation of the shift of the first pattern due to variations in focus during lithography of the first pattern.

Referring to FIG. 10A, an image of patterns formed in a double-patterning process is shown. Patterns 1002 are formed in a first layer while patterns 1004 are formed in a second layer. A field of view 1006 is selected for pattern analysis to determine overlay. FIG. 10B shows the designed location of the first patterns 1008 for the selected field of view 1006. FIG. 10C shows simulation results for the formed patterns in region 1010 in FIG. 10B at different lithographic foci. At an ideal lithographic focus, pattern 1012 is formed. However, with changes in lithographic focus, the shape of the pattern changes, as shown with pattern 1014. This alteration in pattern shape results in a pattern position shift, as shown by arrows 1016a and 1016b, which may adversely affect accurate determination of a representative point for the layer and subsequent overlay measurements.

Thus, process variations, which cause shifts in the patterns, may affect overlay measurement accuracy and/or precision. To accommodate process variations, pattern selection for overlay measurement consideration can employ pattern symmetry. By applying symmetric pattern sampling with respect to one or more axes, the effect of these systematic position shifts can be reduced and/or negated. For example, a pattern formed in a double-patterning process is shown in FIG. 11A. FIG. 11B shows simulation results for different fields of view. As illustrated, the direction of variation in field of view (a) proceeds in an opposite direction to the variation in field of view (b) with changes in lithographic focus. By selection of images and/or patterns so as to include both (a) and (b) for analyzing overlay, the variations due to lithographic focus changes can be minimized. Position shift from design or simulated values due to lithography proximity effects, even at the best or optimal focus, may also affect overlay measurement accuracy and/or precision. The variations due to this proximity effect can also be minimized by using the disclosed pattern symmetry techniques.

Figure 13A:
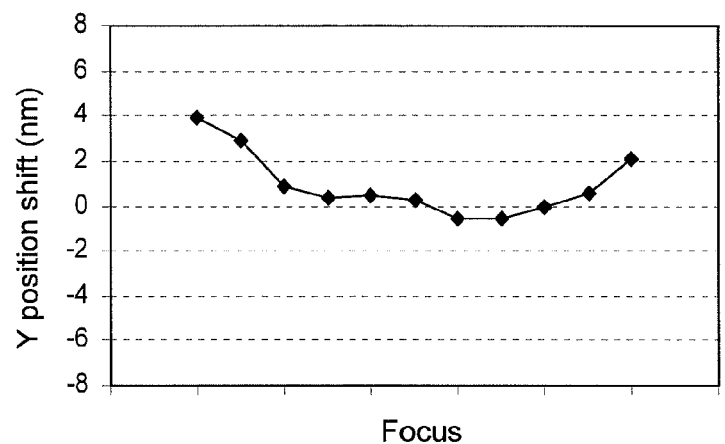
FIG. 13A is a graph of position shift of pattern 1202a in FIG. 12 versus lithographic focus.
Figure 13B:
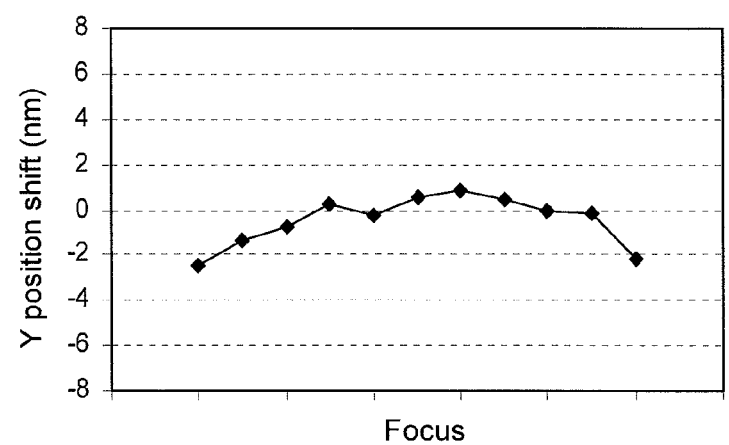
FIG. 13B is a graph of position shift of pattern 1202b in FIG. 12 versus lithographic focus.
Figure 13C:
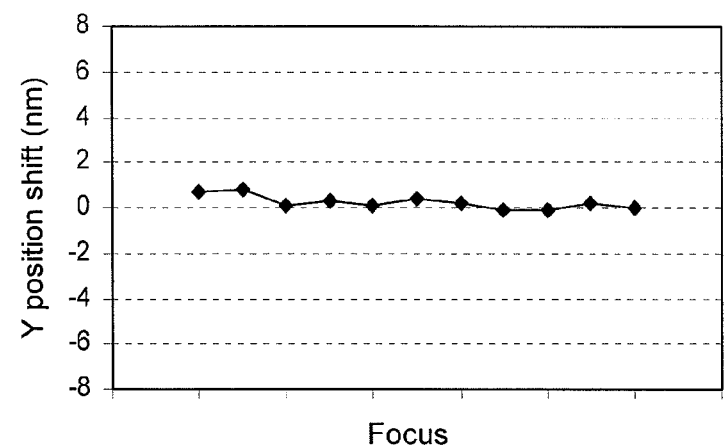
FIG. 13C is a graph of averaged position shift based on first pattern symmetry versus lithographic focus.

Referring now to FIG. 12, an image of patterns formed in a double-patterning process is shown. Patterns 1202 are formed in a first layer while patterns 1204 are formed in a second layer. Patterns 1202 have a respective axis of symmetry 1206. Thus, pattern 1202a is a mirror image of pattern 1202b with respect to the axis 1206. FIG. 13A shows the variation of the position of pattern 1202a with changes in lithographic focus. FIG. 13B shows the variation of the position of pattern 1202b with changes in lithographic focus. As FIGS. 13A-13B illustrate, the variations in the positions of patterns 1202a and 1202b are in opposite directions with respect to lithographic focus change. By combining the positions of pattern 1202a and 1202b analysis, the variations due to lithographic focus change can be minimized. For example, by averaging the position of patterns 1202a and 1202b yields the graph in FIG. 13C. As shown, a minimal shift in the position occurs with respect to lithographic focus change. Accordingly, a position of the layer would not be effected by process variations.

Figures 14A, 14B, 14C:
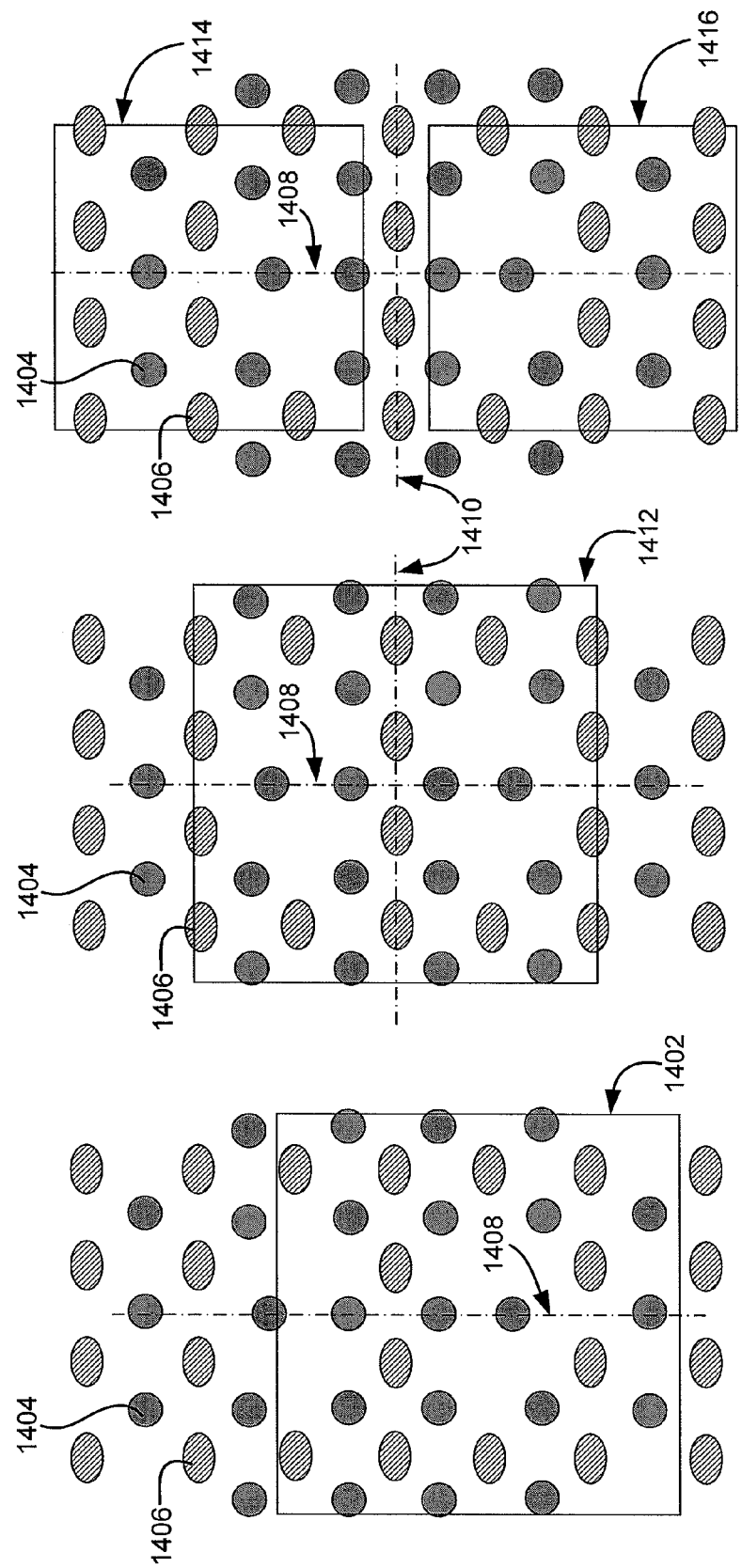
FIG. 14A is a diagram illustrating pattern selection for overlay measurement based on symmetry with respect to a first axis.
FIG. 14B is a diagram illustrating pattern selection for overlay measurement based on symmetry with respect to two axes.
FIG. 14C is a schematic diagram illustrating multiple pattern selections for overlay measurement based on symmetry with respect to two axes.

FIGS. 14A-14C illustrate examples for selection of pattern samples taking pattern symmetry into account. Patterns 1404 are formed in a first layer while patterns 1406 are formed in a second layer. The pattern selection 1402 in FIG. 14A has symmetry with respect to a single axis 1408 extending across the first pattern. In comparison, the pattern selection 1412 in FIG. 14B has symmetry with respect to a first axis 1408 and a second axis 1410 orthogonal to the first axis 1408. The selection of a field of view with two-axis symmetry compensates for process variations in two dimensions.

It is also possible to select multiple images based on pattern symmetry. Such an approach may be necessary when the symmetry of the pattern extends beyond the field of view of the image. As shown in FIG. 14C, a first image 1414 has symmetry with respect to a single axis 1408 while a second image 1416 also has symmetry with respect to axis 1408. However, the two images together are symmetric with respect to the second orthogonal axis 1410.

Figure 15:
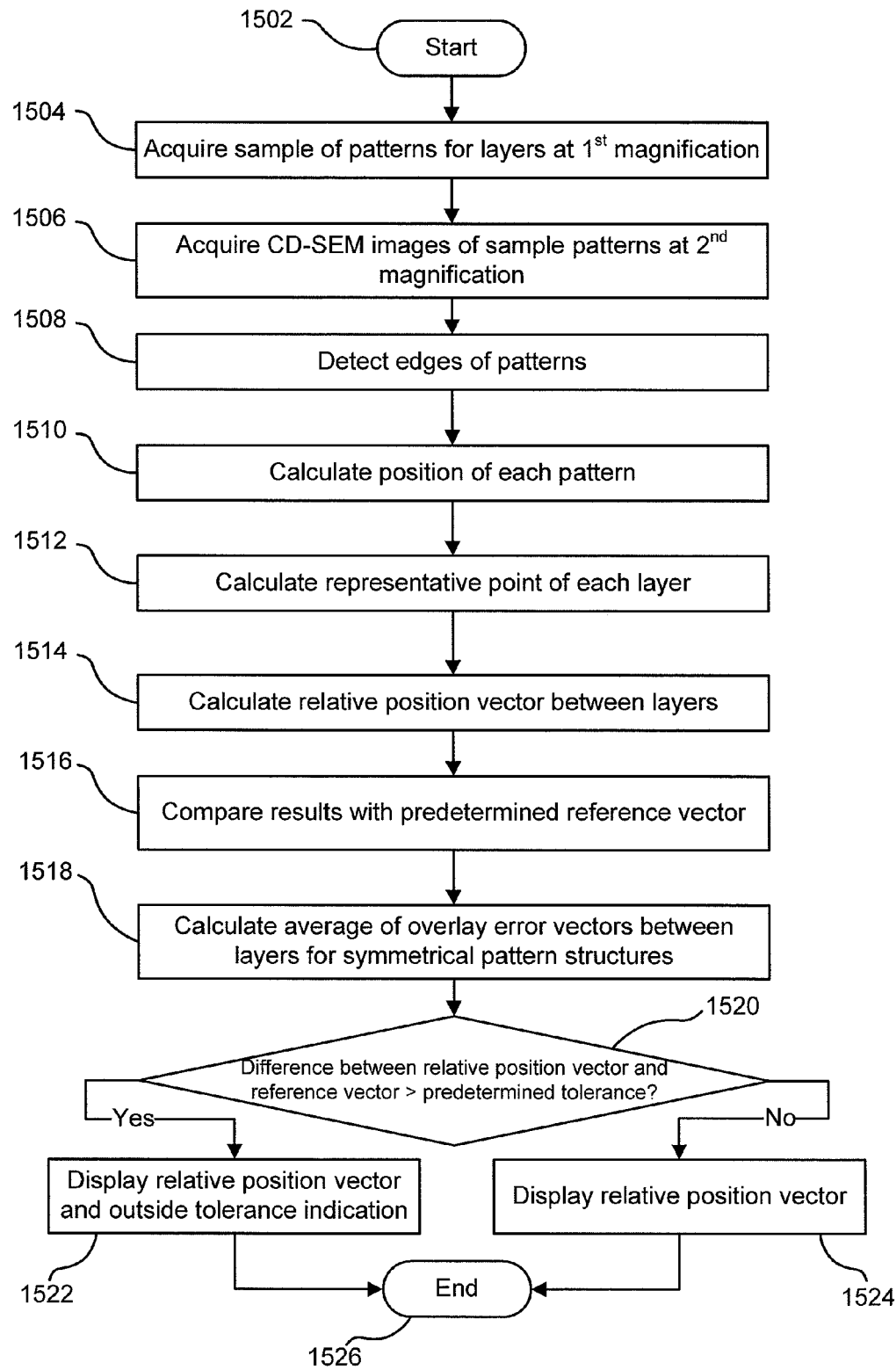
FIG. 15 is a process flowchart illustrating steps for acquiring and analyzing CD-SEMS based on pattern symmetry, according to one or more embodiments.

Referring now to FIG. 15, a process flow diagram for acquiring and analyzing CD-SEM images based on symmetry according to one or more embodiments is shown. The process commences at 1502 and proceeds to step 1504. At step 1504, structures formed on a substrate are imaged at a first low magnification to confirm the position of the patterns. Based on the low magnification image or images, a sample of the patterns can be selected for further analysis. Although this procedure may be skipped, it may be advantageous to use low magnification to confirm the positions of the patterns in selecting the pattern in step 1506.

The process then proceeds to step 1506. In step 1506, one or more CD-SEM images are obtained for the one or more selected patterns for each layer. The CD-SEM images are obtained at a second magnification, which may be greater than the first magnification. Multiple CD-SEM images may be necessary to allow imaging of the entire device structure area of interest at the second magnification level. It is further contemplated that, in some applications, the first and second magnification levels may be the same.

The process then proceeds to step 1508. In step 1508, the edges of all or only a portion of selected patterns in the acquired images are detected using, for example, conventional image processing techniques for critical dimension metrology. The process proceeds to step 1510. In step 1510, the detected edge data is then used to calculate the position of individual patterns in the acquired images.

The process then proceeds to step 1512, wherein a representative point is calculated for each layer based on the position of each pattern in the acquired images. The positions of all or selected patterns which belong to one layer in acquired images define the position of that layer by calculating a representative position for the layer based on those patterns.

The process then proceeds to step 1514. In step 1514, a relative position vector is calculated based on the representative positions. The process then proceeds to step 1516. In step 1516, the relative position vector is compared to a predetermined reference vector, and an overlay error vector is calculated as the difference between the relative position vector and the reference position vector. For example, the relative position vector is compared with a calculated or simulated reference vector. The calculated reference vector may be based on a design layout for the layers. The simulated reference vector may be based on a simulated contour.

The process proceeds to step 1518. To compensate for process variations, an average of overlay error vectors for symmetrical pattern structures formed on the substrate is calculated. For example, vector average calculation module 712 of image processing module 630 may determine such an average.

The process then proceeds to step 1520. If the overlay error is determined to be greater than the predetermined tolerance, the process proceeds to step 1522 where the relative position vector and an indication that the overlay error is out of tolerance are displayed. If the overlay error is determined to be less than the predetermined tolerance, the process proceeds to step 1524 where the relative position vector is displayed. The process thus terminates at step 1526.

Figures 16A, 16B:
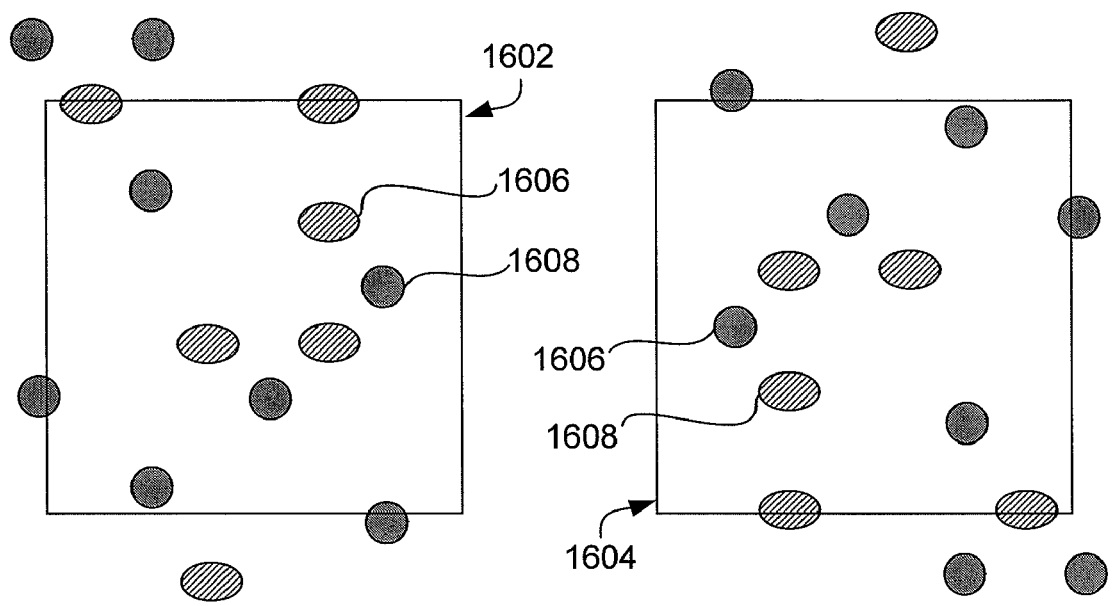
FIG. 16A is a diagram illustrating a field of view of a double-pattern with no apparent symmetry formed on a substrate.
FIG. 16B is a diagram of another field of view having a 180° symmetry with respect to the field of view of the double-pattern in FIG. 16A.

Another example of pattern selection taking into account symmetry is shown in FIGS. 16A-B. FIG. 16A shows an example of an image 1602 with no apparent pattern symmetry. Patterns 1606 are formed in a first layer while patterns 1608 are formed in a second layer. Although there is no apparent pattern symmetry in image 1602, another location on the substrate may have 180° symmetry with respect to image 1602. For example, image 1604 in FIG. 16B has 180° pattern symmetry (for example, reversed and flipped) with respect to image 1602 in FIG. 16A. By employing both images in the overlay measurement analysis, position variations due to lithographic focus changes or other process variations can be compensated.

The techniques disclosed herein can be applied to any patterns or features. For example, the patterns may be holes, such as contact holes. The patterns may also be features on active layers, gate layers, or wiring layers. For example, the overlay measurement may be determined between pattern features in a gate layer and pattern features in an active layer.

The systems and methods described herein are also applicable to layers with single patterns therein. For example, the first layer may include a single pattern, such as a single contact hole, whereas the second layer may include one or more patterns, such as an array of contact holes.

The systems and methods described herein are also applicable to relative position measurements in a single layer. For example, the disclosed techniques can be used to assess the relative position shift of individual features depending on process condition variations, such as lithography focus offset.

In addition, the systems and methods described herein are not limited to double-patterning processes. Multi-patterning processes, including double-, triple-, and quadruple-patterning processes, would also benefit from the disclosed techniques. Moreover, the systems and methods described herein are also applicable to relative position measurement between layers formed via processes other than the multi-patterning processes. So long as the patterns of both layers appear on the imaged surface, the disclosed techniques and embodiments are applicable.

The embodiments described herein have been chosen to best illustrate the principles of the invention and its practical application and to thereby enable others skilled in the applicable arts to utilize the invention. Various embodiments with various modifications depending on the particular use are contemplated. It is thus intended that the scope of the invention be defined by the Claims appended hereto and their equivalents.

The invention claimed is:

1. A method for measuring relative positions of a plurality of semiconductor device layers, comprising:
   selecting one or more patterns for each semiconductor device layer;
   obtaining one or more critical dimension scanning electron microscope (CD-SEM) images of said selected patterns; and calculating a relative pattern position between each said semiconductor device layer in vector form based on said obtained CD-SEM images, wherein each said semiconductor device layer includes one or more patterns, and wherein said one or more selected patterns are selected based on line symmetry or point symmetry of said patterns within at least one said semiconductor device layer.

2. The method of claim 1, wherein said selecting further comprises:

selecting a virtual x-axis and a virtual y-axis so that said selected patterns for each semiconductor device layer are line symmetric with respect to said virtual x-axis and y-axis.

3. The method of claim 1, wherein said calculating further comprises:

extracting edge information associated with said selected patterns in said CD-SEM images; and determining a pattern position of each of said plurality of semiconductor device layers based on said edge information.

4. The method of claim 3, wherein said determining a pattern position further comprises:

calculating a pattern position centroid for each of said selected patterns based on the edge information.

5. The method of claim 3, wherein said edge information represents a contour of at least one of said selected patterns.

6. The method of claim 1, further comprising:

displaying the relative pattern position in vector form on an output display device.

7. The method of claim 6, further comprising:

displaying a pattern position of each said semiconductor device layer together with the relative pattern position on the output display device.

8. The method of claim 1, wherein each said semiconductor device layer is formed using a different mask.

9. The method of claim 1, wherein said relative pattern position includes two-dimensional position information.

10. The method of claim 1, wherein said one or more patterns comprise a portion of a semiconductor device.

11. The method of claim 1, wherein said one or more patterns include contact holes for a semiconductor device.

12. The method of claim 1, wherein said one or more patterns include gates of a semiconductor device.

13. The method of claim 1, further comprising:

comparing said relative pattern position to a predetermined reference value; and outputting a notification if a difference between said relative pattern position and said predetermined reference value exceeds a predetermined tolerance.

14. The method of claim 1, wherein a magnification used to confirm the position of the patterns is lower than that used for said obtaining one or more CD-SEM images.

15. A method for measuring relative positions of a plurality of semiconductor device layers in a double-patterning semiconductor fabrication process, comprising:

selecting a plurality of patterns for each semiconductor device layer;

obtaining one or more critical dimension scanning electron microscope (CD-SEM) images of said selected patterns;

extracting edge information associated with said patterns in said CD-SEM images, said edge information comprising a contour of at least one of said selected patterns;

determining a pattern position for each said semiconductor device layer by calculating a pattern position centroid of each of said selected patterns based on the edge information;

calculating a relative pattern position between each said semiconductor device layer in vector form based on the determined pattern positions;

displaying on an output display device said relative pattern position between each semiconductor device layer in vector form;

displaying on the output display device the pattern position of each said semiconductor device layer together with the relative pattern position between each semiconductor device layer;

comparing said relative pattern position between each said semiconductor device layer to a predetermined reference value; and outputting a notification if a difference between said relative pattern position and said predetermined reference value exceeds a predetermined tolerance, wherein said plurality of patterns includes contact holes for a semiconductor device, wherein each said semiconductor device layer is formed using a different mask, wherein a magnification used for confirming the positions of the patterns is lower than that used for said obtaining one or more CD-SEM images, wherein said relative pattern position includes position information in two dimensions, and wherein said plurality of selected patterns are selected based on a symmetry of said contact holes in at least a first pattern of said plurality of selected patterns, said symmetry of contact holes being determined with respect to at least one line extending in a first direction across said first pattern.

16. The method of claim 15, wherein said plurality of patterns includes one or more patterns comprising a portion of the semiconductor device, wherein said plurality of patterns includes a second pattern overlaid with the first pattern, and wherein said contact holes further include holes in said second pattern.

17. The method of claim 16, wherein said symmetry of contact holes is determined with respect to the line extending in the first direction across said first pattern and a second line extending in a second direction different from that of said first line.

18. The method of claim 17, wherein said second line extends in said second direction across at least said first pattern and said second pattern.

19. A system for measuring relative positions of a plurality of semiconductor device layers in a double-patterning semiconductor device fabrication process, comprising:

an image acquisition module configured to select a plurality of patterns for each said semiconductor device layer and to obtain one or more critical dimension scanning electron microscope (CD-SEM) images of said selected patterns;

an image processing module configured to extract edge information associated with said selected patterns in said CD-SEM images, said edge information comprising a contour for each said selected pattern;

calculate pattern position centroids of said selected patterns based on the edge information;

determine a pattern position for each said semiconductor device layer based on the calculated pattern position centroids; and calculate a relative pattern position between each said semiconductor device layer in vector form based on the determined pattern positions;

compare said relative pattern position between each said semiconductor device layer to a predetermined reference value; a display device; and an output module configured to output to the display device a notification if the difference between said relative pattern position and said predetermined reference value exceeds a predetermined tolerance; and output to the display device the pattern position for each said semiconductor device layer together with the relative pattern position in vector form, wherein said plurality of patterns includes contact holes for a semiconductor device, wherein each said semiconductor device layer is formed using a different mask, wherein a magnification used to confirm the positions of the plurality of patterns is lower than that used to obtain the one or more CD-SEM images, wherein said relative pattern position includes two-dimensional position information, wherein said plurality of selected patterns are selected based on a symmetry of said contact holes in at least a first pattern of said plurality of selected patterns, said symmetry of contact holes being determined with respect to at least one line extending in a first direction across said first pattern, wherein said plurality of patterns includes one or more patterns comprising a portion of the semiconductor device, wherein said plurality of patterns includes a second pattern overlaid with said first pattern, wherein said contact holes further include holes in said second pattern, and wherein said symmetry of contact holes is determined with respect to the line extending in the first direction across said first pattern and a second line extending in a second direction different from that of said first line.

20. The system according to claim 19, wherein at least one of the image acquisition module and the image processing module is part of a CD-SEM system.

* * * * *